United States Patent [19]
Chadbourne

[11] 3,978,399
[45] Aug. 31, 1976

[54] INTEGRATING FLUXMETER WITH INPUT CURRENT COMPENSATION TO CANCEL DRIFT

[75] Inventor: Thomas G. Chadbourne, Boston, Mass.

[73] Assignee: Walker Magnetics Group, Inc., Worcester, Mass.

[22] Filed: Feb. 14, 1975

[21] Appl. No.: 550,115

[52] U.S. Cl. .......................... 324/43 R; 324/130; 330/9
[51] Int. Cl.² ................. G01R 33/02; H03F 1/02
[58] Field of Search ................ 324/43 R, 47, 130; 330/9

[56] References Cited
UNITED STATES PATENTS

| | | | |
|---|---|---|---|
| 2,930,973 | 3/1960 | Gilbert | 324/43 R |
| 3,070,786 | 12/1962 | MacIntyre | 330/9 |
| 3,265,979 | 8/1966 | Staunton | 330/9 |
| 3,448,393 | 6/1969 | Rice, Jr. | 330/9 |
| 3,509,460 | 4/1970 | Mizrahi | 330/9 |
| 3,518,563 | 6/1970 | Ainsworth | 330/9 |

FOREIGN PATENTS OR APPLICATIONS 2,123,047  11/1971  Germany ................. 330/9

OTHER PUBLICATIONS

Gordon et al.; Use of Operational Amp for Meas. Flux. Density; Amer. Jour. of Phy.; vol. 38 No. 1; Jan. 1970; pp. 94–98.

Jaeger et al.; Dynamic Zero-Correction Method Suppesses Offset; Elec., Dec. 1972; pp. 109–110.

*Primary Examiner*—Robert J. Corcoran
*Attorney, Agent, or Firm*—Kenway & Jenney

[57] ABSTRACT

The integrating fluxmeter disclosed herein employs a second electronic integrator which operates during the intervals between test periods to adjust a compensating bias current, applied to the main integrator, to a value accurately canceling any residual drift. The integrating capacitor employed in this second electronic integrating circuit is of sufficient size so that the value of the compensating current does not vary significantly during a test period.

1 Claim, 2 Drawing Figures

INTEGRATING FLUXMETER WITH INPUT CURRENT COMPENSATION TO CANCEL DRIFT

BACKGROUND OF THE INVENTION

The present invention relates to a fluxmeter and more particularly to a fluxmeter of the type in which flux is measured by electronically integrating the voltage generated in a test coil over a test period during which the flux linking the coil is changed by an amount to be measured.

Fluxmeters are conventionally constructed employing electronic integrator circuits, usually of the so-called Miller type. In such a circuit, an integrating capacitor is connected from the output of an inverting amplifier to its input so that the output voltage from the amplifier varies as a function of the time integral of any current applied to the input terminal.

In order to make a measurement, the integrating capacitor is momentarily shorted, e.g., by a push button switch, in order to zero the output of the instrument and the flux change to be measured is then imposed on the measuring coil. The value of the integral is then read as a function of the resultant output voltage of the integrator.

Usually the amplifier selected for the integrator is of a type exhibiting a very low level of bias current and a small offset voltage so as to minimize errors in the output signal due to integration of the bias current and offset voltage. In the absence of an input signal, the error signal appears as a residual drift of the output signal. Typically, a compensating current is supplied to the input terminal to at least partially offset any residual drift and this compensating current is manually adjusted to achieve minimum drift in the absence of any input signal. The optimum value of compensating current will, however, typically vary as a function of various influences, e.g., temperature, component aging, and so forth, as is familiar to those skilled in the electronic arts. Thus, in order to achieve an accurate measurement, it is typically necessary to manually readjust the value of compensating current just prior to the taking of each measurement. As will be understood, this adjustment procedure is relatively time consuming since the drift, which is the time integral of only the uncompensated offset current, must reach an observable level before any further adjustment can be made.

Among the several objects of the present invention may be noted the provision of a fluxmeter of improved accuracy and ease of operation; the provision of such a fluxmeter which is of the integrating type and in which a compensating current provided to the main integrating circuit is automatically adjusted to an optimum value; the provision of such an apparatus in which the value of compensating current is automatically adjusted between test periods; and the provision of such apparatus which is highly reliable and which is of relatively simple and inexpensive construction. Other objects and features will be in part apparent and in part pointed out hereinafter.

SUMMARY OF THE INVENTION

Briefly, a fluxmeter constructed in accordance with the present invention measures flux by integrating the voltage generated in a coil over a test period during which the flux linking the coil is changed. The coil voltage is integrated by a circuit comprising a first inverting amplifier together with an integrating capacitor which connects the amplifier's output terminal to its input terminal so that the output voltage of the amplifier varies as an integral over time of any current applied to the input terminal, less the bias current of the amplifier itself. A second, essentially similar integrator is provided and the output signal from the second integrator controls the value of a compensating current applied to the input terminal of the first integrator. The second integrator is selectively driven by a current which varies as a function of the output voltage of the first integrator, the correction current being applied in a sense tending to reduce the voltage of the output terminal of the first amplifier.

Between test periods, the selective connection is made between the input of the second integrator and the output of the first integrator so that the correction current is automatically adjusted to a value which compensates for any variation in the bias current of the first integrator. The value of the integrating capacitor in the second integrator is selected so that the value of the correction current does not change significantly during a test period, i.e., when the connection between the output of the first integrator and the input of the second integrator is opened.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
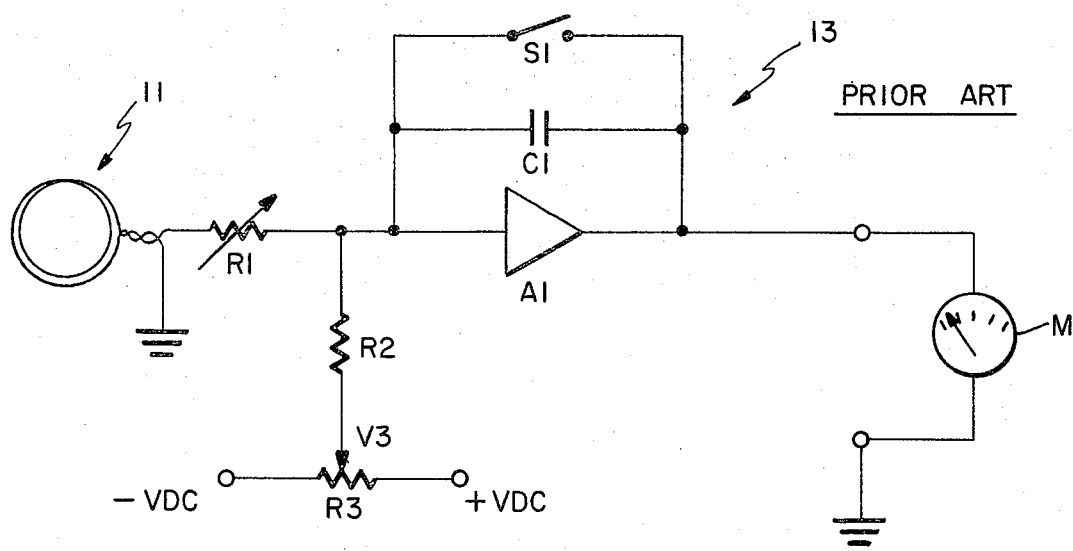
FIG. 1 is a schematic diagram of a conventional or prior art type fluxmeter.

Referring now to FIG. 1, there is indicated at 11 a test coil through which is introduced the flux to be measured. One side of the test coil 11 is connected to ground while the other side is connected, through a variable resistance R1, to an electronic integrator circuit 13. Resistor R1 allows the sensitivity of the integrator to test coil voltage to be adjusted so that test coils of different sizes and numbers of turns may be used. Integrator circuit 13 comprises high gain inverting amplifier A1 together with a feedback capacitor C1 which connects the output terminal of the amplifier A1 to its input terminal. Typically, several alternate capacitor values are provided to permit range shifting so as to facilitate flux measurements at various levels.

Capacitor C1 is shunted by a switch S1 which permits the capacitor C1 to be momentarily shorted for resetting the integrator prior to conducting a test measurement. During the test period itself, the flux linking the test coil is changed by the amount to be measured and the resultant voltage developed at the output of the integrator 13 is measured by a voltmeter M. Meter M may be of analog or digital type and may, if desired, incorporate suitable range switching circuitry.

In order to achieve useful accuracy, amplifier A1 is conventionally selected to be of a type, e.g., chopper stabilized, which exhibits very low and stable values of offset and bias current. Even with carefully selected components, however, there will typically be some residual drift due to integration of the amplifier bias current itself. Thus, it is conventional to apply an adjustable compensating current. In FIG. 1 such a compensating current is provided through a resistor R2 from a variable voltage source comprising a potentiometer R3 connected between appropriate positive and negative reference voltages.

In use, this compensating current is preferably set just shortly prior to the test period since the residual offset current may vary with time and temperature as well as with other ambient conditions. To set the bias current, the potentiometer R3 is manually adjusted until there is no observable drift with the switch S1 open. However, as will be understood, this adjustment procedure is a relatively time consuming process since only the residual offset current is being integrated and the drift may thus build relatively slowly before reaching an accurately observable level.

Figure 2:
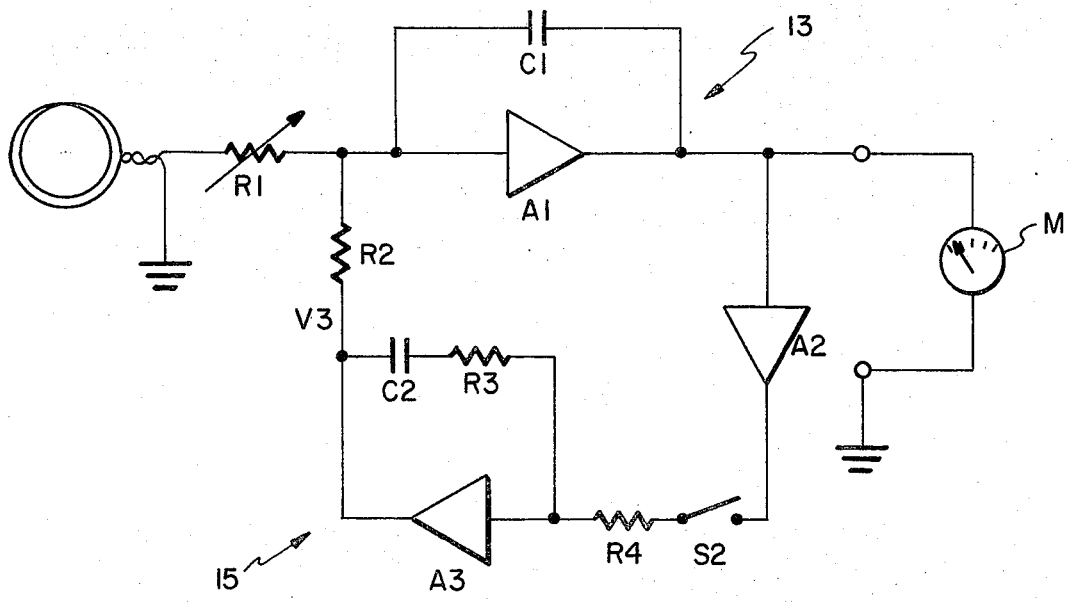
FIG. 2 is a schematic diagram of a fluxmeter constructed in accordance with the present invention.

In the embodiment illustrated in FIG. 2, the compensating current is obtained, not from a fixed or manually adjustable source, but from a second integrator, designated generally by reference character 15. Integrator 15 is similar to the main integrator 13 in that it involves an inverting amplifier A3 and a feedback capacitor C2 so that the output voltage of amplifier A3 varies as a function of the integral over time of any current applied to the input terminal of the amplifier. A resistor R3, inserted in the feedback path in series with the capacitor C2, provides a phase shift at higher frequencies which provides stable operation when the system is operated in a closed loop mode as described in greater detail hereinafter.

The integrator 15 is selectively driven by a current which is proportional to the output voltage provided by the main integrator 13. In the circuit illustrated, this current is inversely proportional to that output voltage, though it will be understood that the current might be directly proportional, i.e., in-phase, if a signal inversion were provided elsewhere in the system. In the FIG. 2 circuit, the inversion is provided by an inverting amplifier A2 while a switch S2 is provided for selectively making or breaking the input connection to the integrator 15.

In operation, the switch S2 is closed between test periods so as to provide a closed-loop feedback system involving both integrators. As may be seen, the D. C. feedback path tends to drive the output voltage at the output of amplifier A1 to zero, i.e., local ground potential, by adjusting the value of the compensating current provided through resistor R2 to a value just equal to the residual offset current of the amplifier A1. While the compensating current will approach this desired value relatively slowly, due to the presence of the two integrators, this process requires no manual intervention or operator attention and can occur during the warm up and stabilizing period usually provided for such systems circuits before any actual testing is undertaken.

As each of the integrators 13 and 15 would produce 90 degrees phase-shifts for AC signals, the closed-loop feedback system would not be stable were it not for the presence of resistor R3, it can be seen that R3 provides a damping characteristic in the closed-loop feedback system by shifting the phase-shift of integrator 15 back towards zero at higher frequencies.

To obtain a flux measurement, the switch S2 is opened and the flux through the test coil 11 is changed in the same manner as in prior art devices, the value of the integral being read as the output voltage of the integrator 13. Since the feedback loop operates to hold the main integrator output voltage at zero prior to the opening of the switch S2, it can be seen that no separate switch is necessary for shorting the main integrating capacitor C1. Further, with the switch S2 open, the integrator 15 operates essentially as a holding circuit, maintaining the compensating current through resistor R2 at the last value extant before the test period was begun. As will be understood, the value of the capacitor C2 is selected so that the output voltage of the integrator 15 will not change significantly during the typical test period, any variations due to the bias current requirements of amplifier A3 being of a second order magnitude only. Since the input characteristics of the main integrating amplifier A1, e.g., its offset and bias current values, can be expected to change very little over the relatively brief test period, it can be seen that a very accurate measurement can be obtained, the compensating current being maintained at the optimum value by the holding circuit.

As suggested previously, the signal inversion shown as being between the main integrator and the input to the second integrator could occur elsewhere in the circuit, e.g., between the output of the second integrator and the resistor R2 through which the compensating current is applied to the main integrator. In either case, it will be understood that the compensating current is applied in a sense tending to reduce the output voltage of the main integrator. Likewise, while the voltage representing the change in flux is shown as being taken directly from the main integrator it should be understood that the voltage at the output of the inverter A2 could likewise be taken as representative of this integral, only a change of sign being involved.

In summary, it may be seen that the addition of a second integrator, operating in closed-loop feedback fashion with the first integrator between test periods, provides for automatic adjustment of the compensating current supplied to the main integrator so as to achieve minimum drift. Further, the second integrator acts as a holding circuit during the actual test measurement so as to effectively maintain this optimum compensating current during the test period.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. In a fluxmeter of the type in which flux is measured by integrating the voltage generated in a coil over a test period during which the flux linking the coil is changed, a test circuit comprising:
   a first amplifier, said amplifier having an output terminal and an input terminal and being of relatively high gain, there being a signal inversion between said terminals;
   an integrating capacitor connected between said input terminal and said output terminal causing the voltage developed at said output terminal to vary as an integral over time of any current applied to said input terminal, less the bias current of said amplifier;
   means including a resistance of preselectable value in series with said coil for selectively applying to said input terminal a current which is proportional to the voltage generated in said coil during a test period;

means for utilizing a voltage which is proportional to the voltage at the output terminal of said amplifier at the end of a test period as an indication of the flux change;

a second amplifier, said amplifier having an output terminal and an input terminal and having substantial gain, there being a signal inversion between the input and output terminals of said second amplifier;

feedback means, including a second integrating capacitor and a phase-shifting resistor in series with said second capacitor, connected between the output terminal and the input terminal of said second amplifier causing the voltage developed at the output terminal to vary substantially as a function of the integral over time of a current applied to the input terminal;

an inverting circuit for providing a voltage which is inversely proportional to the output voltage of said first amplifier;

means including a switch and a series resistor for selectively applying to the input terminal of said second amplifier, between test periods, a current which varies as a function of said inversely proportional voltage; and means including a relatively high value resistance for continuously applying to the input terminal of said first amplifier a correction current in proportion to the voltage at the output terminal of said second amplifier, the correction current being applied in a sense tending to reduce the voltage at the output terminal of said first amplifier, whereby, between test periods, said correction current is automatically adjusted to a value which compensates for said bias current, the value of said second integrating capacitor being such that the value of said correction current does not change significantly during a test period.

* * * * *

UNITED STATES PATENT AND TRADEMARK OFFICE
CERTIFICATE OF CORRECTION

PATENT NO. : 3,978,399
DATED : August 31, 1976
INVENTOR(S) : Thomas G. Chadbourne It is certified that error appears in the above—identified patent and that said Letters Patent are hereby corrected as shown below:

Column 5, claim 1, line 2, change "said amplifier"

to --said first amplifier--.

Signed and Sealed this

Thirtieth Day of November 1976

[SEAL]

Attest:

RUTH C. MASON
*Attesting Officer*

C. MARSHALL DANN
*Commissioner of Patents and Trademarks*